United States Patent
Ye et al.

(10) Patent No.: US 11,310,939 B2
(45) Date of Patent: Apr. 19, 2022

(54) COOLANT DISTRIBUTION UNIT

(71) Applicant: Auras Technology Co., Ltd., New Taipei (TW)

(72) Inventors: Tian-Li Ye, New Taipei (TW); Wei-Hao Chen, New Taipei (TW); Chien-Yu Chen, New Taipei (TW); Chien-An Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/125,203

(22) Filed: Dec. 17, 2020

(65) Prior Publication Data

US 2021/0274680 A1 Sep. 2, 2021

Related U.S. Application Data (60) Provisional application No. 62/982,194, filed on Feb. 27, 2020.

(51) Int. Cl.
 *H05K 7/20* (2006.01)
(52) U.S. Cl.
 CPC ................. *H05K 7/20272* (2013.01)
(58) Field of Classification Search
 CPC ........... H05K 7/20272; H05K 7/20781; H05K 7/20772; H05K 7/2079; H05K 7/20763; H05K 7/20
 See application file for complete search history.

(56) References Cited

U.S. PATENT DOCUMENTS

| | | | | |
|---|---|---|---|---|
| 5,757,151 A | * | 5/1998 | Donegan | F28D 1/0308 318/150 |
| 5,941,300 A | * | 8/1999 | Colling | F28F 27/00 165/47 |
| 2003/0116104 A1 | * | 6/2003 | Zlotek | F01P 3/20 123/41.31 |
| 2003/0185483 A1 | * | 10/2003 | Bennett | G02B 6/4246 385/14 |
| 2005/0141196 A1 | * | 6/2005 | Yamatani | G06F 1/20 361/699 |
| 2007/0235167 A1 | * | 10/2007 | Brewer | H05K 7/20772 165/104.33 |
| 2011/0112694 A1 | * | 5/2011 | Bash | F24F 11/0001 700/277 |
| 2017/0181326 A1 | * | 6/2017 | Shelnutt | H05K 7/20772 |
| 2019/0178592 A1 | * | 6/2019 | Chen | H05K 7/20836 |

* cited by examiner

*Primary Examiner* — Adam B Dravininkas
(74) *Attorney, Agent, or Firm* — Muncy, Geissler, Olds & Lowe, PC (57) ABSTRACT

A coolant distribution unit includes a casing, a control module, a power supply module, a heat exchange module, and a fluid driving module. The power supply module is electrically connected to the control module, the fluid driving module is electrically connected to the control module and the power supply module, and the fluid driving module is in fluid communication with the heat exchange module. The control module, power supply module, heat exchange module, and fluid driving module are all arranged in the casing. In addition, the control module controls the power supply module to output a corresponding electrical power to the fluid driving module according to an operation status of the fluid driving module.

12 Claims, 7 Drawing Sheets

COOLANT DISTRIBUTION UNIT

RELATED APPLICATIONS

This application claims priority to U.S. Provisional Application Ser. No. 62/982,194, filed Feb. 27, 2020, and Taiwan Application Serial Number 109140620, filed Nov. 19, 2020, the disclosures of which are incorporated herein by reference in their entireties.

TECHNICAL FIELD

The present disclosure generally relates to a coolant distribution unit. More particularly, the present disclosure relates to a coolant distribution unit able to adjust an operation performance of a fluid driving module according to an operation status of the fluid driving module.

BACKGROUND

A rack coolant distribution unit (Rack CDU) is a water-cooled device used in the server device. The rack coolant distribution unit can directly deliver coolant through multiple pipelines to a server rack to cool the electronic components, such as central processing units or any other electronic components, in the server rack. The rack coolant distribution unit can continuously deliver the coolant to the server rack and take away the heat inside the server rack through relevant pumps, a closed circulation pipeline and a back-end heat exchanger.

However, due to the rapid changes in technology, the racks used to store the server device are designed with various specifications in order to meet various requirements. The heat dissipation requirements of the various server racks are not the same. Therefore, the conventional rack coolant distribution unit cannot satisfy with all of sudden abnormal overheating problems of various server racks or server devices and control the working fluid thereof so as to lead to insufficient heat dissipation for certain server racks or certain unexpected abnormal situations. Therefore, there is a need to solve the above-mentioned problems.

SUMMARY

One objective of the embodiments of the present invention is to provide a coolant distribution unit able to adjust an operation performance of a fluid driving module according to an operation status of the fluid driving module.

To achieve these and other advantages and in accordance with the objective of the embodiments of the present invention, as the embodiment broadly describes herein, the embodiments of the present invention provides a coolant distribution unit including a casing, a control module, a power supply module, a heat exchange module and a fluid driving module. The power supply module is electrically connected to the control module and the fluid driving module is electrically connected to the control module and the power supply module, and communicated with the heat exchange module. The control module, the power supply module, the heat exchange module and the fluid driving module are arranged in the casing, and the control module controls the power supply module to output a corresponding electrical power to the fluid driving module to operate the fluid driving module according to an operation status of the fluid driving module.

In some embodiments, the control module, the power supply module and the fluid driving module are detachably arranged in the casing.

In some embodiments, the control module includes a main control unit and the fluid driving module includes a plurality of pumps, wherein according to an operation status of one pump of the pumps of the fluid driving module, the main control unit of the control module adjusts another pump of the pumps of the fluid driving module.

In some embodiments, the coolant distribution unit further includes a first liquid inlet, a second liquid inlet, a first liquid outlet, a second liquid outlet and a plurality of pipeline channels arranged in the casing. The first liquid inlet, the second liquid inlet, the first liquid outlet and the second liquid outlet allow working fluid passing through and communicated with the pipeline channels arranged in the casing, the pumps of the fluid driving module drives the working fluid to flow in the heat exchange module and the pipeline channels, and the heat exchange module communicates with the first liquid inlet, the second liquid inlet, the first liquid outlet and the second liquid outlet by way of the pipeline channels.

In some embodiments, the coolant distribution unit further includes a plurality of quick connectors, each of the quick connectors is connected to one corresponding pump of the pumps of the fluid driving module and one corresponding pipeline channel of the pipeline channels. In addition, the each of the quick connectors prevents the working fluid from leaking from the corresponding pipeline channel while the corresponding pump is removed.

In some embodiments, a path from the first liquid inlet to the first liquid outlet is an external circulation path to connect a cooling device. In addition, a path from the second liquid inlet to the second liquid outlet is an inner circulation path to connect a plurality of cold plates of a server device.

In some embodiments, the fluid driving module outputs a first analog signal of the one pump of the pumps to the main control unit of the control module, the main control unit receives the first analog signal converts the first analog signal into a digital signal with an analog/digital converter built in the main control unit, the main control unit determines an operation status of the pump of the pumps of the fluid driving module according to the digital signal, and a digital/analog converter built in the main control unit converts the digital signal into a second analog signal and outputs to the fluid driving module to control the another pump of the pumps of the fluid driving module after the main control unit processes the digital signal.

In some embodiments, when the main control unit is abnormal or removed from the casing, the power supply module directly outputs an electrical power to the fluid driving module to run the pumps of the fluid driving module at full speed.

In some embodiments, the coolant distribution unit further includes a sensing module, a flow regulating module and a display module. The control module further includes an extension control unit electrically connected to the main control unit, the sensing module communicates with the first liquid inlet, the second liquid inlet, the first liquid outlet, the second liquid outlet or the pipeline channels to sense sensing data of the working fluid in the first liquid inlet, the second liquid inlet, the first liquid outlet, the second liquid outlet or the pipeline channels. In addition, the flow regulating module communicates with the pipeline channels to control a flow rate of the working fluid flowing in the pipeline channels. The main control unit of the control module electrically connects to the sensing module and the flow regulating module, and the main control unit electrically communicates with an external monitoring center through the extension control unit to send the sensing data to the external monitoring center through the extension control unit.

In some embodiments, the main control unit adjusts operation performances of the pumps of the fluid driving module according to the sensing data of the working fluid in the first liquid inlet, the second liquid inlet, the first liquid outlet, the second liquid outlet or the pipeline channels.

In some embodiments, the control module reads a real-time temperature data of the server device stored in a cloud control center with a network switch, and the main control unit of the control module determines whether the server device is overheated according to the real-time temperature data of the server device and controls the fluid driving module to adjust the operation performances of the pumps of the fluid driving module.

In some embodiments, the heat exchange module includes a heat exchanger and a liquid storage unit, the liquid storage unit equips with at least one level gauge, and the main control unit of the control module determines a liquid level in the liquid storage unit according to sensing signals from the at least one level gauge to control the fluid driving module to adjust the operation performances of the pumps of the fluid driving module.

Hence, according to the operation status of one pump, the coolant distribution unit can effectively control the operation performance of another pump. In addition, the coolant distribution unit can also control the operation performance of the pumps according to the sensing data of the working fluid. Furthermore, the coolant distribution unit can control the operation performance of the pumps according to the temperature of the working fluid and/or the liquid level of the liquid storage unit. In addition, when the main control unit is abnormal or removed from the casing, the power supply module may directly output an electrical power to the fluid driving module to run the pumps of the fluid driving module at full speed.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
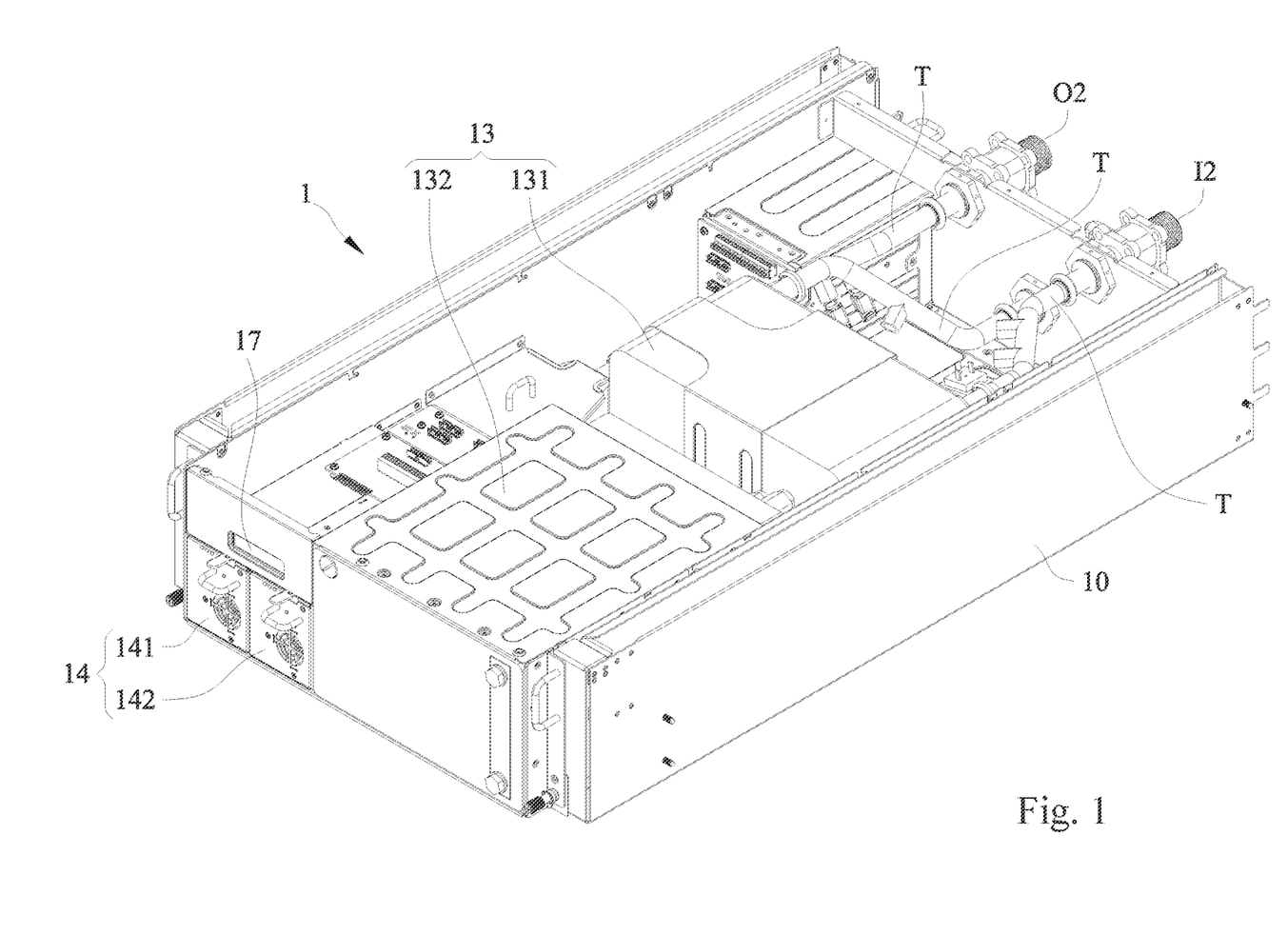
FIG. 1 illustrates a schematic perspective diagram showing a coolant distribution unit according to one embodiment of the present invention.
Figure 2:
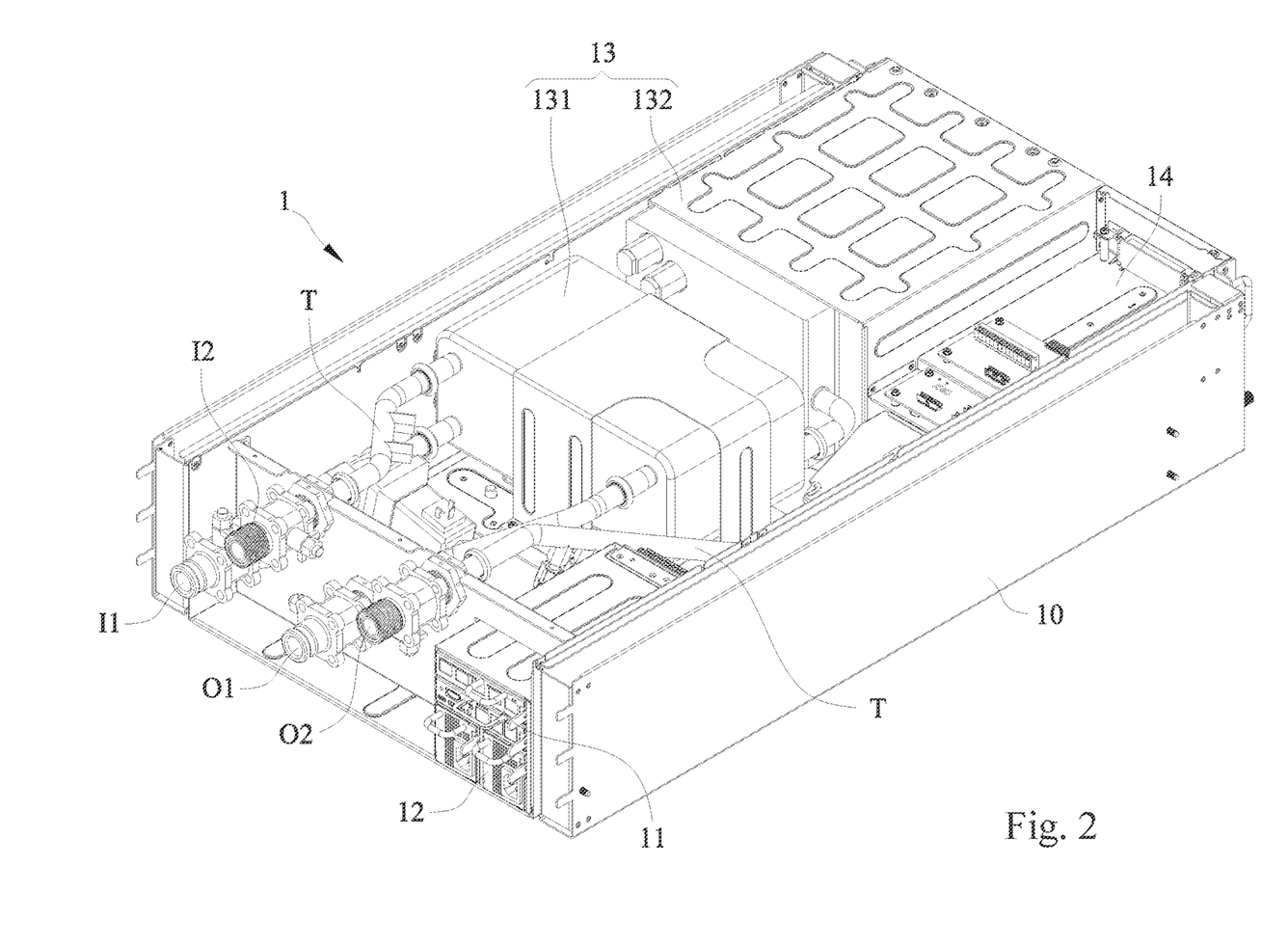
FIG. 2 illustrates another schematic perspective diagram of the coolant distribution unit of FIG. 1.
Figure 3:
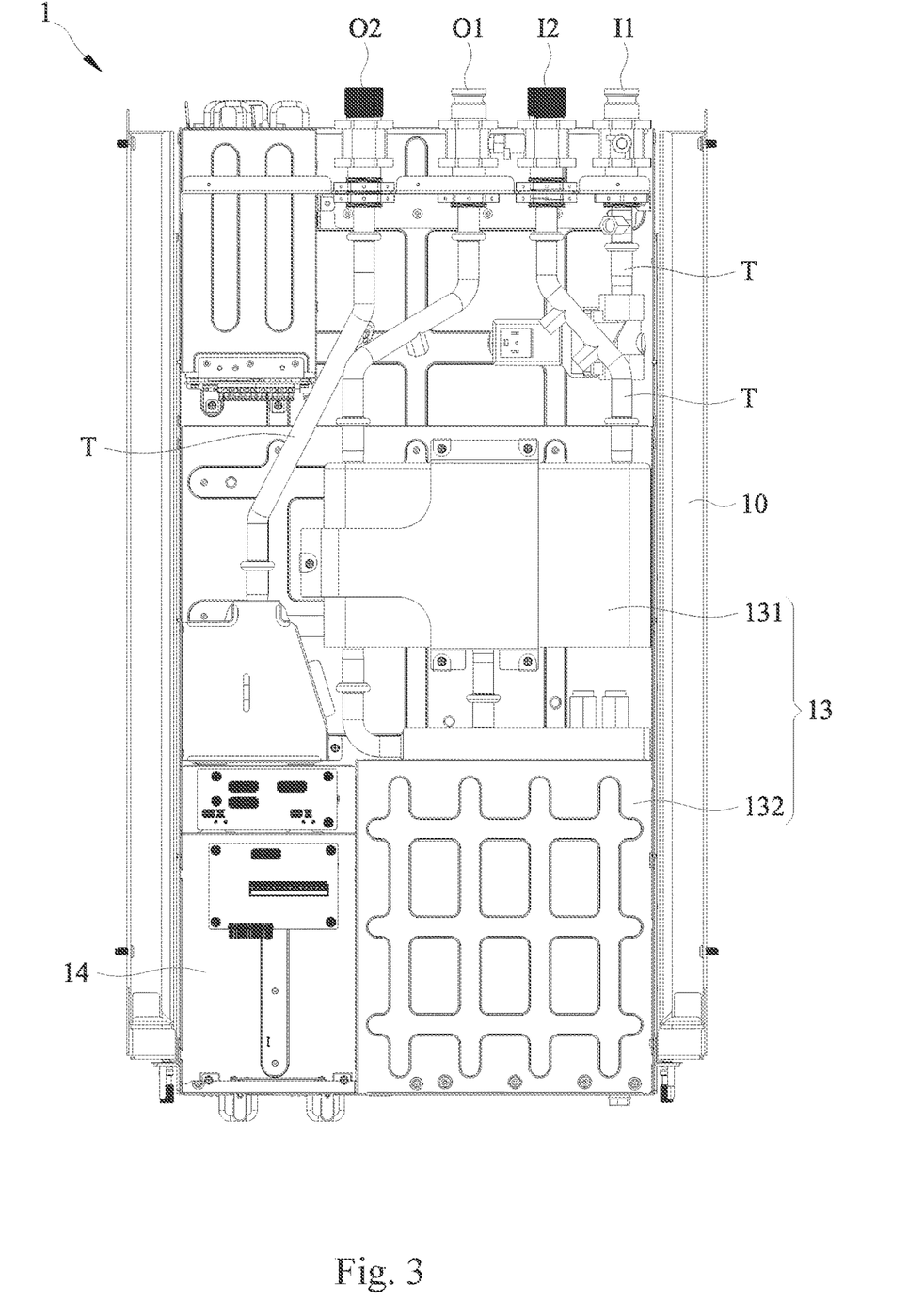
FIG. 3 illustrates a schematic top view of the coolant distribution unit of FIG. 1.
Figure 4:
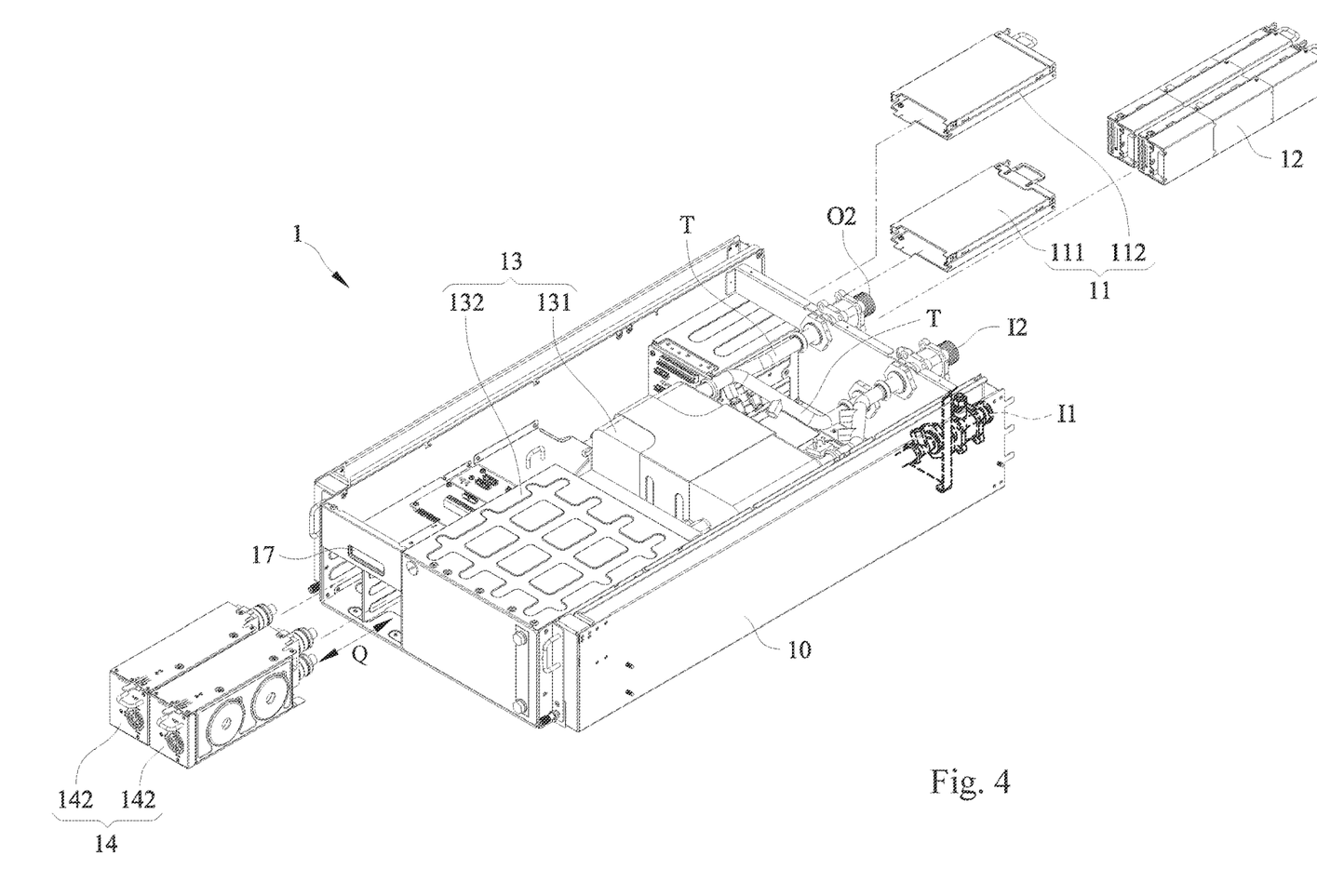
FIG. 4 illustrates a schematic partial exploded view of the coolant distribution unit of FIG. 1.
Figure 5:
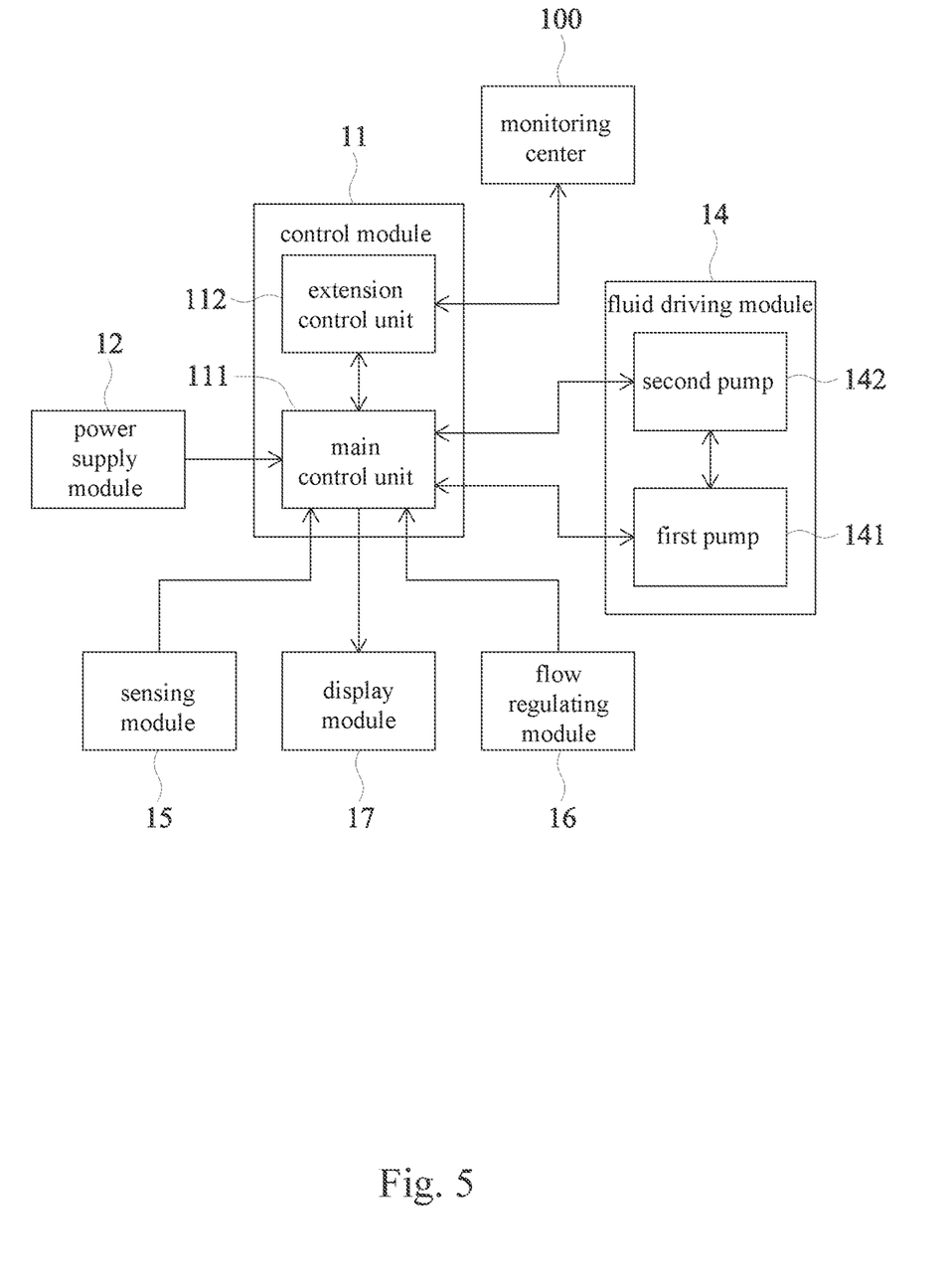
FIG. 5 illustrates a schematic functional block diagram of the coolant distribution unit of FIG. 1.
Figure 6:
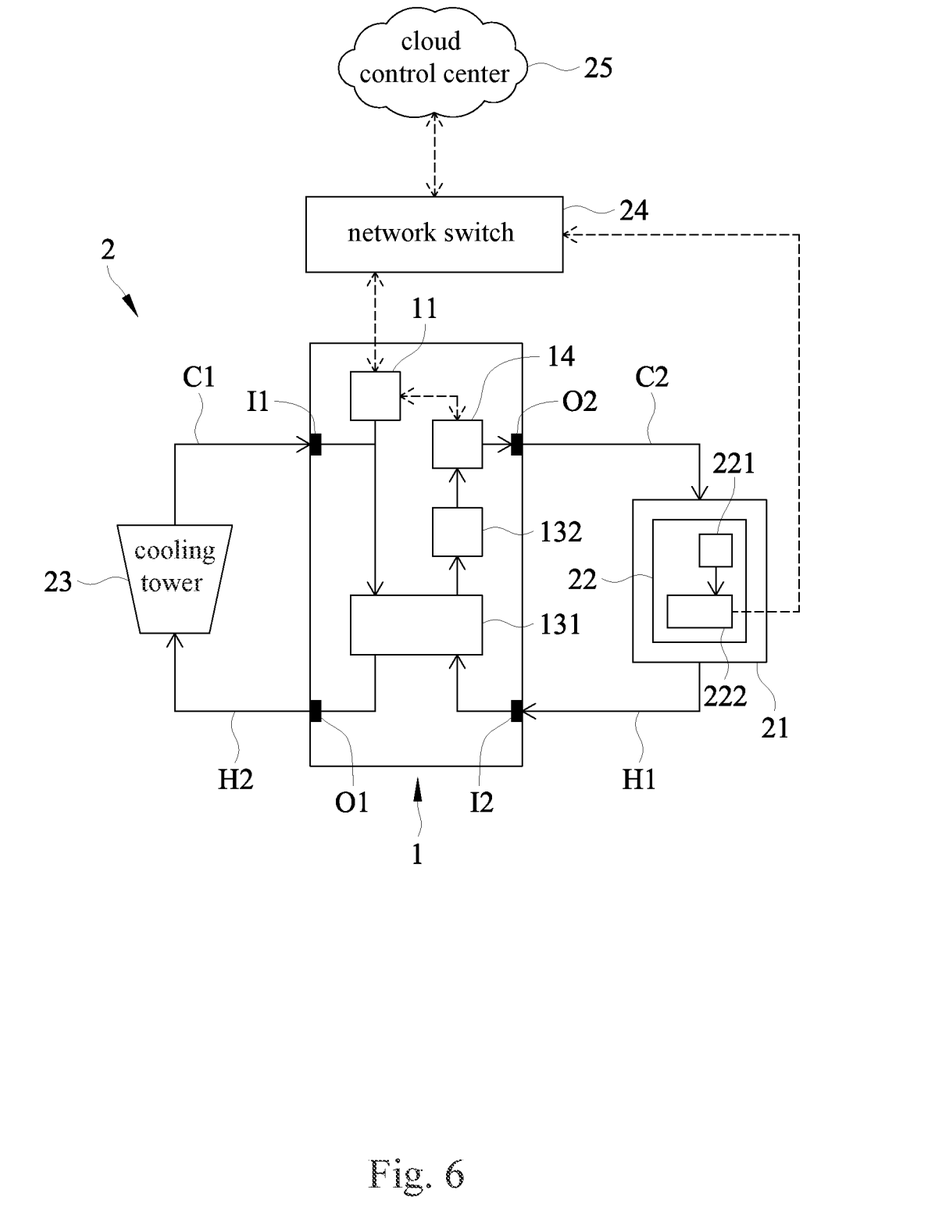
FIG. 6 illustrates a schematic diagram of the coolant distribution unit of FIG. 1 equipped in a rack cooling system.
Figure 7:
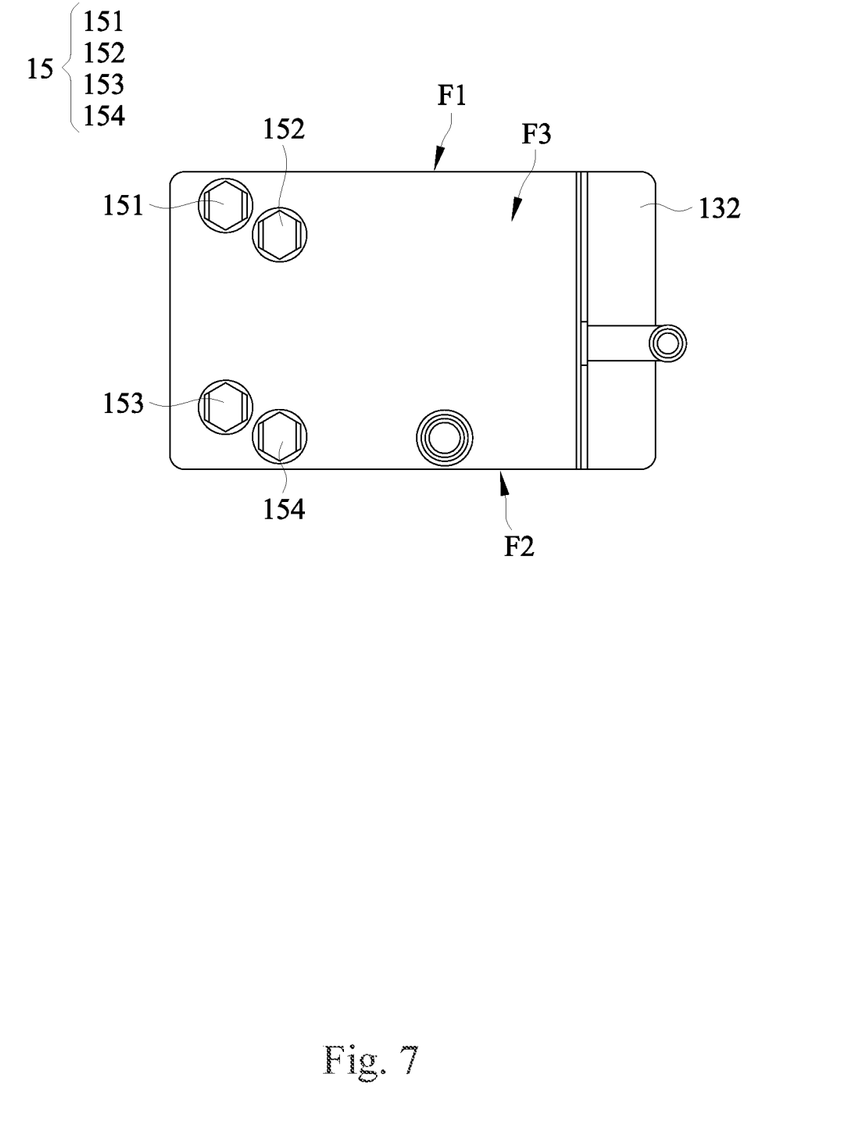
FIG. 7 illustrates a schematic side view of a liquid storage unit of the coolant distribution unit of FIG. 1.

FIG. 1 illustrates a schematic perspective diagram of a coolant distribution unit, FIG. 2 illustrates another schematic perspective diagram thereof, FIG. 3 illustrates a schematic top view thereof, FIG. 4 illustrates a schematic partial exploded view thereof, FIG. 5 illustrates a schematic functional block diagram thereof, FIG. 6 illustrates a rack cooling system with the coolant distribution unit, and FIG. 7 illustrates a schematic side view of a liquid storage unit thereof. In addition, in order to clearly illustrate the internal components of the coolant distribution unit 1, the upper cover of the coolant distribution unit 1 shown in FIG. 1 to FIG. 4 is removed therefrom.

As illustrated in FIG. 1 to FIG. 6, the coolant distribution unit 1 includes a casing 10, a control module 11, a power supply module 12, a heat exchange module 13 and a fluid driving module 14. The control module 11, the power supply module 12, the heat exchange module 13 and the fluid driving module 14 are arranged in the casing 10. In some embodiments, the coolant distribution unit 1 further includes a first liquid inlet I1, a second liquid inlet I2, a first liquid outlet O1 and a second liquid outlet O2. The first liquid inlet I1, the second liquid inlet I2, the first liquid outlet O1 and the second liquid outlet O2 can allow a working fluid flowing therein and are connected to pipeline channels T in the casing 10. The control module 11 electrically connects to the power supply module 12 and the fluid driving module 14, and the control module 11 can control the power supply module 12 to output a corresponding electrical power to the fluid driving module 14 according to the actual demand to operate the fluid driving module 14. The fluid driving module 14 can drive the working fluid in the heat exchange module 13 and the pipeline channels T, and the heat exchange module 13 connects to the pipeline channels T, the heat exchange module 13 communicates with the first liquid inlet I1, the second liquid inlet I2, the first liquid outlet O1 and the second liquid outlet O2 through the pipeline channels T.

In some embodiments, the control module 11, the power supply module 12 and the fluid driving module 14 are detachably arranged in the casing 10. That is to say, the control module 11, the power supply module 12 and the fluid driving module 14 can be plugged into and unplugged from the casing 10 according to the actual demand. The user can respectively remove the control module 11, the power supply module 12 and the fluid driving module 14 from the casing 10 with the handles thereof.

The heat exchange module 13 includes a heat exchanger 131 and a liquid storage unit 132, the fluid driving module 14 is disposed at one side of the liquid storage unit 132 of the heat exchange module 13, and the fluid driving module 14 is in fluid communication with the liquid storage unit 132. Referring to FIG. 6, when the coolant distribution unit 1 is equipped in a rack cooling system 2, the first liquid inlet I1 provides a low temperature working fluid C1, without waste heat, from the cooling tower 23 into the coolant distribution unit 1, the second liquid inlet I2 collects a high temperature working fluid H1 passed through the server device 22, and the first liquid outlet O1 exhausts a high temperature working fluid H2 with waste heat, that is, the low temperature working fluid C1 enters into the coolant distribution unit 1 from the first liquid inlet I1 and passes through the heat exchanger 131 to carry out the waste heat. The second liquid outlet O2 exhausts a low temperature working fluid C2 out of the coolant distribution unit 1 to transmit to a cold plate 21 which is in thermal contact with the server device 22, that is, the high temperature working fluid H1 enters into the coolant distribution unit 1 from the second liquid inlet I2 and sequentially passes through the heat exchanger 131, the liquid storage unit 132 and the fluid driving module 14 to reduce the temperature thereof to form the low temperature working fluid C2 that is transmitted to a cold plate 21. In another word, the path from the first liquid inlet I1 to the first liquid outlet O1 is an external circulation path of the coolant distribution unit 1, and the path from the second liquid inlet I2 to the second liquid outlet O2 is an inner circulation path of the coolant distribution unit 1. In addition, the so-called high temperature and low temperature are relative compared. For example, the high temperature working fluid H2 has a higher temperature relative to the low temperature working fluid C1, and the high temperature working fluid H1 has a higher temperature relative to the low temperature working fluid C2.

In some embodiments, the heat exchanger 131 is, for example, a plate heat exchanger to provide a heat exchange area for the low temperature working fluid C1 entering from the first liquid inlet I1 and the high temperature working fluid H1 entering from the second liquid inlet I2 so that the heat carried by the high temperature working fluid H1 from the server device 22 is exchanged into the low temperature working fluid C1. In some embodiments, the heat exchanger 131 of the coolant distribution unit 1 is preferably a small heat exchanger, therefore the heat exchanger 131 is not limited to the plate heat exchanger, and the heat exchanger 131 can be any small heat exchanger without departing from the spirit and the scope of the invention.

In addition, the liquid storage unit 132 is used to temporarily store the working fluid passed through the heat exchanger 131 for buffering purposes, such as a water storage tank or a liquid storage tank with any geometric shape, and is made of the material not to interact with the working fluid, such as stainless steel, etc. Moreover, the fluid driving module 14 is utilized to transfer the low temperature working fluid C2 from the liquid storage unit 132 to the second liquid outlet O2 with the electrical power to provide the low temperature working fluid C2 to the cold plate 21.

As shown in FIG. 2, FIG. 4 and FIG. 5, in some embodiments, the control module 11 includes a main control unit 111, a fluid driving module 14 includes a first pump 141 and a second pump 142. In some embodiments, the main control unit 111 of the control module 11 can adjust the operation performance of the fluid driving module 14 according to the operation status of the fluid driving module 14. For example, when the first pump 141 and the second pump 142 of the fluid driving module 14 are operating normally, the fluid driving module 14 outputs a first analog signal, for example, a rotational speed signal of the first pump 141 or the second pump 142, to the main control unit 111 of the control module 11, and an analog/digital converter built in the main control unit 111 converts the first analog signal into a digital signal while the main control unit 111 receiving the first analog signal. The main control unit 111 may determine that the operation status of the first pump 141 or the second pump 142 of the fluid driving module 14 is a normal status according to the digital signal, and then the main control unit 111 can further process the digital signal and a digital/analog converter built in the main control unit 111 can convert the digital signal into a second analog signal, for example, a pulse width modulation signal, to output the second analog signal to the fluid driving module 14 so as to control the first pump 141 or the second pump 142 of the fluid driving module 14 to maintain a current rotational speed.

When one of the first pump 141 and the second pump 142 of the fluid driving module 14 is operated abnormal, for example, the rotational speed of the first pump 141 is greater than 7000 rpm, i.e. under an idle rotation, or the rotational speed is lower than 1000 rpm, i.e. the pump is stopped or pulled out therefrom, the fluid driving module 14 can output a first analog signal to the main control unit 111 of the control module 11. The main control unit 111 receives the first analog signal and converts into a digital signal with the analog/digital converter built in the main control unit 111, the main control unit 111 can determine the operation status of the first pump 141 of the fluid driving module 14 is abnormal according to the digital signal, and the main control unit 111 can further process the digital signal and convert the digital signal into the second analog signal, i.e. a pulse width modulation signal, with the digital/analog converter built in the main control unit 111, and output to the second pump 142 of the fluid driving module 14 to increase the rotational speed of the second pump 142, for example, 10%-20% rotational speed increment or at full speed. At this time, the power supply module 12 can provide a corresponding electrical power to the second pump 142 of the fluid driving module 14 to maintain a normal operation of the coolant distribution unit 1 so as to prevent the server device 22 connected to the coolant distribution unit 1 from overheating.

It is worth noting that, when the main control unit 111 fails or is removed from the casing 10 for maintenance, the fluid driving module 14 cannot receive the second analog signal from the main control unit 111. At this time, the power supply module 12 can directly output the electrical power to the fluid driving module 14 to operate the first pump 141 and the second pump 142 of the fluid driving module 14 at a full rotational speed although the main control unit 111 fails or removed therefrom so that the coolant distribution unit 1 can be normally operated to prevent the fluid driving module 14 from shutting down and the server rack from overheating.

In some embodiments, the fluid driving module 14 includes two pumps, i.e. the first pump 141 and the second pump 142, is only an exemplary embodiment of the present invention. In another embodiment, the fluid driving module 14 may include more than two pumps and the main control unit 111 of the control module 11 can adjust the operation performance according to any one operation status of the pumps. For example, when the fluid driving module 14 is equipped with three pumps, the main control unit 111 can control the survived pump to increase the rotational speed thereof if two of the pumps fail, and the main control unit 111 can control the two survived pumps to increase the rotational speed thereof if one of the pumps fails.

In some embodiments, the pumps of the fluid driving module 14, i.e. the first pump 141 and the second pump 142, are connected to the pipeline channels T with quick connectors Q. When the fluid driving module 14 is pulled out from the casing 10, the quick connectors Q can prevent the working fluid from leaking from the corresponding pipeline channel T.

In some embodiments, the coolant distribution unit 1 is operated with a cooling tower 23 disposed in an external circulation path to cool down the temperature of the high temperature working fluid H2 having the waste heat exhausted from the first liquid outlet O1 to form the low temperature working fluid C1. In another embodiment, the cooling tower 23 can replace with any other cooling device, for example, a fan, a water-cooled radiator module or a water-cooled radiator module with a fan, to cool down the temperature of the high temperature working fluid H2 having the waste heat exhausted from the first liquid outlet O1 to form the low temperature working fluid C1. For example, when the cooling tower 23 is replaced with a fan, the fan can blow the external circulation path to reduce the temperature of the working fluid, and when the cooling tower 23 is replaced with a water-cooled radiator module, the water-cooled radiator module can be connected to the external circulation path to reduce the temperature of the working fluid, and when the cooling tower 23 is replaced with a water-cooled radiator module with a fan, the water-cooled radiator module can be connected to the external circulation path and the fan can assist in blowing the water-cooled radiator module to reduce the temperature of the working fluid.

In some embodiments, as shown in FIG. 2, FIG. 4 and FIG. 5, the coolant distribution unit 1 further includes a sensing module 15, a flow regulating module 16 and a display module 17. The control module 11 further includes an extension control unit 112. The sensing module 15 can connect to the first liquid inlet I1, the second liquid inlet I2, the first liquid outlet O1, the second liquid outlet O2 or the pipeline channels T to sense the sensing data of the working fluid in the first liquid inlet I1, the second liquid inlet I2, the first liquid outlet O1, the second liquid outlet O2 or the pipeline channels T. In some embodiments, the sensing data is, for example, temperature data, flow rate data or pressure data of the working fluid. The flow regulating module 16 can connect to the pipeline channels T to control the flow rate of the working fluid flowing in the pipeline channel T. The main control unit 111 of the control module 11 electrically connects to the sensing module 15 and the flow regulating module 16, and the main control unit 111 electrically connects to the monitoring center 100 through the extension control unit 112. The main control unit 111 receives the sensing data measured by the sensing module 15 and transmits the sensing data to the monitoring center 100 through the extension control unit 112. The monitoring center 100 sends control commands to the extension control unit 112 to transmit to the main control unit 111 according to the foregoing sensing data, and the main control unit 111 controls the flow regulating module 16 according to the control command. The display module 17 is utilized to display, for example, the temperature data, the flow rate data or the pressure data measured by the sensing module 15. In some embodiments, the sensing module 15 includes a thermal sensor, a flow meter or a pressure gauge. In some embodiments, the flow regulating module 16 includes a proportional valve, and the display module 17 includes a liquid crystal display without departing from the spirit and the scope of the invention. The sensing module 15, the flow regulating module 16 and the display module 17 can select suitable components according to the actual demand without departing from the spirit and the scope of the invention.

In some embodiments, the main control unit 111 can control the operation performance of the fluid driving module 14 according to the operation status of the fluid driving module 14, and the main control unit 111 can also control the operation performance of the fluid driving module 14 according to the sensing data of the working fluid measured by the sensing module 15 located at the first liquid inlet I1, the second liquid inlet I2, the first liquid outlet O1, the second liquid outlet O2 or the pipeline channels T. For example, when the temperature of the high temperature working fluid H1 is higher than 80 degrees Celsius at the second liquid inlet I2, that is, the temperature of the working fluid absorbed the waste heat of a plurality of server devices 22 is higher than 80 degrees Celsius, the main control unit 111 controls the first pump 141 or the second pump 142 of the fluid driving module 14 to speed up the rotational speed thereof, for example, 10%~20% rotational speed increment. At this moment, the power supply module 12 provides a corresponding electrical power to the fluid driving module 14 to ensure no overheating problem occurred in the server devices 22 connected to the coolant distribution unit 1.

As shown in FIG. 6, in some embodiments, the server device 22 includes a temperature sensor 221 and a control unit 222, the rack cooling system 2 further includes a network switch 24 and a cloud control center 25. The temperature sensor 221 can instantaneously detect the temperature of the server device 22 to get the temperature data, the control unit 222 receives the temperature data and transmit the same to the cloud control center 25 through the network switch 24 to store the temperature data measured by the temperature sensor 221 in the cloud control center 25, the control module 11 of the coolant distribution unit 1 can read the real-time temperature data of the server device 22 stored in the cloud control center 25 through the network switch 24, and the main control unit 111 of the control module 11 can determine whether an overheating problem occurred in the server device 22 according to the temperature data. If the main control unit 111 determines that the server device 22 is overheated, the main control unit 111 sends a control signal to the fluid driving module 14 to increase the rotational speed of the first pump 141 or the second pump 142 of the fluid driving module 14 to prevent the server device 22 connected to the coolant distribution unit 1 from overheating.

Referring to FIG. 7, FIG. 7 illustrates a schematic side view of a liquid storage unit of the coolant distribution unit of FIG. 1. As shown in FIG. 7 and simultaneously referring to FIGS. 1-5, in some embodiments, the sensing module 15 may include a plurality of level gauges 151, 152, 153, 154. The level gauges 151, 152, 153, 154 are disposed in the liquid storage unit 132, and the level gauges 151, 152, 153, 154 are sequentially distributed on the lateral surface F3 of the liquid storage unit 132 from the top surface F1 to the bottom surface F2. The level gauge 151, 152, 153, 154 are respectively disposed at a high liquid level, a normal liquid level, a low liquid level or a warning liquid level of the working fluid in the liquid storage unit 132. When the liquid level of the working liquid in the liquid storage unit 132 is lower than the level gauge 153, that is, the working liquid in the liquid storage unit 132 is below a standard required, at this time, the main control unit 111 of the control module 11 cannot receive the sensing signal from the level gauge 153, and then the main control unit 111 determines that the liquid level of the working fluid in the liquid storage unit 132 is too low and sends a control signal to the fluid driving module 14 to reduce the rotational speed of the first pump 141 or the second pump 142 of the fluid driving module 14 to prevent the first pump 141 or the second pump 142 from idling so as to effectively protect the fluid driving module 14.

Hence, according to the operation status of one pump, the coolant distribution unit can effectively control the operation performance of another pump. In addition, the coolant distribution unit can also control the operation performance of the pumps according to the sensing data of the working fluid. Furthermore, the coolant distribution unit can control the operation performance of the pumps according to the temperature of the working fluid and/or the liquid level of the liquid storage unit. In addition, when the main control unit is abnormal or removed from the casing, the power supply module may directly output an electrical power to the fluid driving module to run the pumps of the fluid driving module at full speed.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A coolant distribution unit, comprising:
   a casing;
   a control module;
   a power supply module electrically connected to the control module;
   a heat exchange module; and
   a fluid driving module electrically connected to the control module and the power supply module, and communicated with the heat exchange module, wherein the control module, the power supply module, the heat exchange module and the fluid driving module are arranged in the casing, and the control module controls the power supply module to output a corresponding electrical power to the fluid driving module to operate the fluid driving module according to an operation status of the fluid driving module.

2. The coolant distribution unit of claim 1, wherein the control module, the power supply module and the fluid driving module are detachably arranged in the casing.

3. The coolant distribution unit of claim 1, wherein the control module comprises a main control unit and the fluid driving module comprises a plurality of pumps, wherein according to an operation status of one pump of the pumps of the fluid driving module, the main control unit of the control module adjusts another pump of the pumps of the fluid driving module.

4. The coolant distribution unit of claim 3, further comprising:
   a first liquid inlet;
   a second liquid inlet;
   a first liquid outlet;
   a second liquid outlet; and
   a plurality of pipeline channels arranged in the casing, wherein the first liquid inlet, the second liquid inlet, the first liquid outlet and the second liquid outlet allow a working fluid passing through and communicated with the pipeline channels arranged in the casing, the pumps of the fluid driving module drives the working fluid to flow in the heat exchange module and the pipeline channels, and the heat exchange module communicates with the first liquid inlet, the second liquid inlet, the first liquid outlet and the second liquid outlet by way of the pipeline channels.

5. The coolant distribution unit of claim 4, further comprising a plurality of quick connectors, each of the quick connectors connecting to one corresponding pump of the pumps of the fluid driving module and one corresponding pipeline channel of the pipeline channels, wherein the each of the quick connectors prevents the working fluid from leaking from the corresponding pipeline channel while the corresponding pump is removed.

6. The coolant distribution unit of claim 4, wherein a path from the first liquid inlet to the first liquid outlet is an external circulation path to connect a cooling device, and a path from the second liquid inlet to the second liquid outlet is an inner circulation path to connect a plurality of cold plates of a server device.

7. The coolant distribution unit of claim 3, wherein the fluid driving module outputs a first analog signal of the one pump of the pumps to the main control unit of the control module, the main control unit receives the first analog signal converts the first analog signal into a digital signal with an analog/digital converter built in the main control unit, the main control unit determines an operation status of the one pump of the pumps of the fluid driving module according to the digital signal, and a digital/analog converter built in the main control unit converts the digital signal into a second analog signal and outputs to the fluid driving module to control the another pump of the pumps of the fluid driving module after the main control unit processes the digital signal.

8. The coolant distribution unit of claim 4, further comprising a sensing module, a flow regulating module and a display module, wherein the control module further comprises an extension control unit electrically connected to the main control unit, the sensing module communicates with the first liquid inlet, the second liquid inlet, the first liquid outlet, the second liquid outlet or the pipeline channels to sense sensing data of the working fluid in the first liquid inlet, the second liquid inlet, the first liquid outlet, the second liquid outlet or the pipeline channels, and the flow regulating module communicates with the pipeline channels to control a flow rate of the working fluid flowing in the pipeline channels, wherein the main control unit of the control module electrically connects to the sensing module and the flow regulating module, and the main control unit electrically communicates with an external monitoring center through the extension control unit to send the sensing data to the external monitoring center through the extension control unit.

9. The coolant distribution unit of claim 8, wherein the main control unit adjusts operation performances of the pumps of the fluid driving module according to the sensing data of the working fluid in the first liquid inlet, the second liquid inlet, the first liquid outlet, the second liquid outlet or the pipeline channels.

10. The coolant distribution unit of claim 6, wherein the control module reads a real-time temperature data of the server device stored in a cloud control center with a network switch, and the main control unit of the control module determines whether the server device is overheated according to the real-time temperature data of the server device and controls the fluid driving module to adjust operation performances of the pumps of the fluid driving module.

11. The coolant distribution unit of claim 3, wherein when the main control unit is abnormal or removed from the casing, the power supply module directly outputs an electrical power to the fluid driving module to run the pumps of the fluid driving module at full speed.

12. The coolant distribution unit of claim 3, wherein the heat exchange module comprises a heat exchanger and a liquid storage unit, the liquid storage unit equips with at least one level gauge, and the main control unit of the control module determines a liquid level in the liquid storage unit according to sensing signals from the at least one level gauge to control the fluid driving module to adjust the operation performances of the pumps of the fluid driving module.

* * * * *